United States Patent
Torres

(10) Patent No.: US 10,969,409 B2
(45) Date of Patent: Apr. 6, 2021

(54) MINIATURIZED CURRENT SENSORS

(71) Applicant: General Electric Company, Schenectady, NY (US)

(72) Inventor: Victor Mario Torres, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 89 days.

(21) Appl. No.: 16/235,380

(22) Filed: Dec. 28, 2018

(65) Prior Publication Data

US 2020/0209284 A1 Jul. 2, 2020

(51) Int. Cl.
| | | |
|---|---|---|
| *G01R 15/18* | (2006.01) | |
| *H01F 5/02* | (2006.01) | |
| *G01R 15/20* | (2006.01) | |
| *G01R 19/00* | (2006.01) | |

(52) U.S. Cl.
CPC ......... *G01R 15/181* (2013.01); *G01R 15/205* (2013.01); *G01R 19/0092* (2013.01); *H01F 5/02* (2013.01)

(58) Field of Classification Search
CPC ............... G01R 15/181; G01R 15/205; G01R 19/0092; H01F 5/02
See application file for complete search history.

(56) References Cited

U.S. PATENT DOCUMENTS

| | | | |
|---|---|---|---|
| 6,414,475 B1 * | 7/2002 | Dames | G01R 15/18 324/127 |
| 8,264,215 B1 | 9/2012 | Kovach et al. | |
| 8,916,995 B2 | 12/2014 | Fujita et al. | |
| 9,069,018 B2 | 6/2015 | Alex et al. | |
| 9,476,915 B2 * | 10/2016 | Ausserlechner | G01R 15/202 |
| 9,564,753 B2 | 2/2017 | Faxvog et al. | |
| 2009/0302862 A1 | 12/2009 | Twerdochlib | |
| 2012/0129301 A1 * | 5/2012 | Or-Bach | H01L 27/10897 438/129 |
| 2017/0315155 A1 * | 11/2017 | Smith | G01R 15/185 |
| 2017/0356935 A1 * | 12/2017 | Hurwitz | G01R 19/12 |
| 2019/0333875 A1 * | 10/2019 | Liao | H01L 23/645 |

FOREIGN PATENT DOCUMENTS

| | | |
|---|---|---|
| CN | 204439784 U | 7/2015 |
| CN | 104833838 | 12/2017 |

OTHER PUBLICATIONS

Ward, D.A., et al.; "Using Rogowski Coils for Transient Current Measurements", Engineering Science and Education Journal, Jun. 1993, vol. 2, Issue 3, pp. 105-113.
De Los Santos, Hector J.; "On the Ultimate Limits of IC Inductors—An RF MEMS Perspective", 2002 Electronic Components and Technology Conference, 0-7803-7430-4/02, 5 pages.

(Continued)

*Primary Examiner* — Akm Zakaria
(74) *Attorney, Agent, or Firm* — Fitch, Even, Tabin & Flannery LLP

(57) ABSTRACT

Miniaturized current sensors are disclosed herein. The miniaturized current sensors may employ a coiled coil and a return coil around the current path to be measured. The miniaturized current sensors may be integrated to microelectronic devices and components.

14 Claims, 8 Drawing Sheets

(56) References Cited

OTHER PUBLICATIONS

Liu, Wai Y., et al.; "Toroidal Inductors for Radio-Frequency Integrated Circuits", IEEE Transactions of Microwave Theory and Techniques, vol. 12, No. 2, Feb. 2004.

Li, Wei, et al.; "The Study of Transient Performance of Current Sensor Based on Rogowski Coil and its Application in Dynamic Simulation Experiment", International Conference on Power System Technology, 2006, pp. 1-6.

\* cited by examiner

MINIATURIZED CURRENT SENSORS

BACKGROUND

The subject matter disclosed herein relates to miniaturized current sensors for microelectronic devices.

This section is intended to introduce the reader to certain aspects of art that may be related to aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Many modern applications may employ microelectronic devices, such as microprocessors, microcontrollers, miniaturized sensors, miniaturized actuators, microfluidic valves, microelectromechanical systems (MEMS), and nanoelectromechanical systems (NEMS). Microelectronic devices may be defined as electronic devices that may employ components that may have sub-millimetric dimensions. Microelectronic devices may be used to reduce the dimensions of electronic devices, decrease the power consumption for applications, and/or increase the density of components. Examples of systems that may employ microelectronic devices include portable and wearable devices, microfluidic devices, microbots, and nanobots. In order to provide improved reliability of microelectronic devices, monitoring of electrical parameters of the device during operation may be of benefit. As such, there is a need for sensors and detectors that may be fabricated and may operate in the small scale of the components in microelectronic devices.

BRIEF DESCRIPTION

Certain embodiments commensurate in scope with the originally claimed invention are summarized below. These embodiments are not intended to limit the scope of the claimed invention and are intended only to provide a brief summary of possible forms of the invention. Indeed, the invention may encompass a variety of forms that may be similar to or different from the embodiments set forth below.

In an embodiment, an integrated circuit die including an electric component and an integrated current sensor is described. The electric component may carry a current through a current path. The current sensor may be disposed around the current path. The current sensor may include a coiled coil that may include multiple loops and is disposed around the current path. The current sensor may also include a return coil connected to the coiled coil and also disposed around the current path.

In another embodiment, a method to form a current sensor in a semiconductor device is described. The method may include a process to pattern a first photoresist layer above a substrate of the semiconductor. The method may include a process to deposit a first metal layer above the substrate of the semiconductor to form portions of a first connector and a second connector, as well as a post for a return coil of the current sensor. The method may include a process for patterning a second photoresist layer above the first metal layer. The method may include a process for depositing a second metal layer above the first metal layer to form portions of a first post coupled to the first connector and of a second post coupled to the second connector. The method may include process for patterning a third photoresist layer, which may include a photoresist above the portion of the return coil.

In an embodiment, a current sensor is described. The current sensor may include a coiled coil disposed along a primary coil and around a current path. The coiled coil may include a plurality of secondary coils or loops, and each loop may have a top metal line, a bottom metal line, a first connector that couples the top metal line to the bottom metal line and a second connector that couples the bottom metal line to an adjacent loop. The top metal lines of the coiled coil may be in a first plane and the bottom metal lines may be in a second plane parallel to the first plane. The current sensor may also include a return coil along a primary coil. The return coil may be disposed in a middle plane parallel to and between the first plane and the second plane. The return coil may be connected to the coiled coil.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
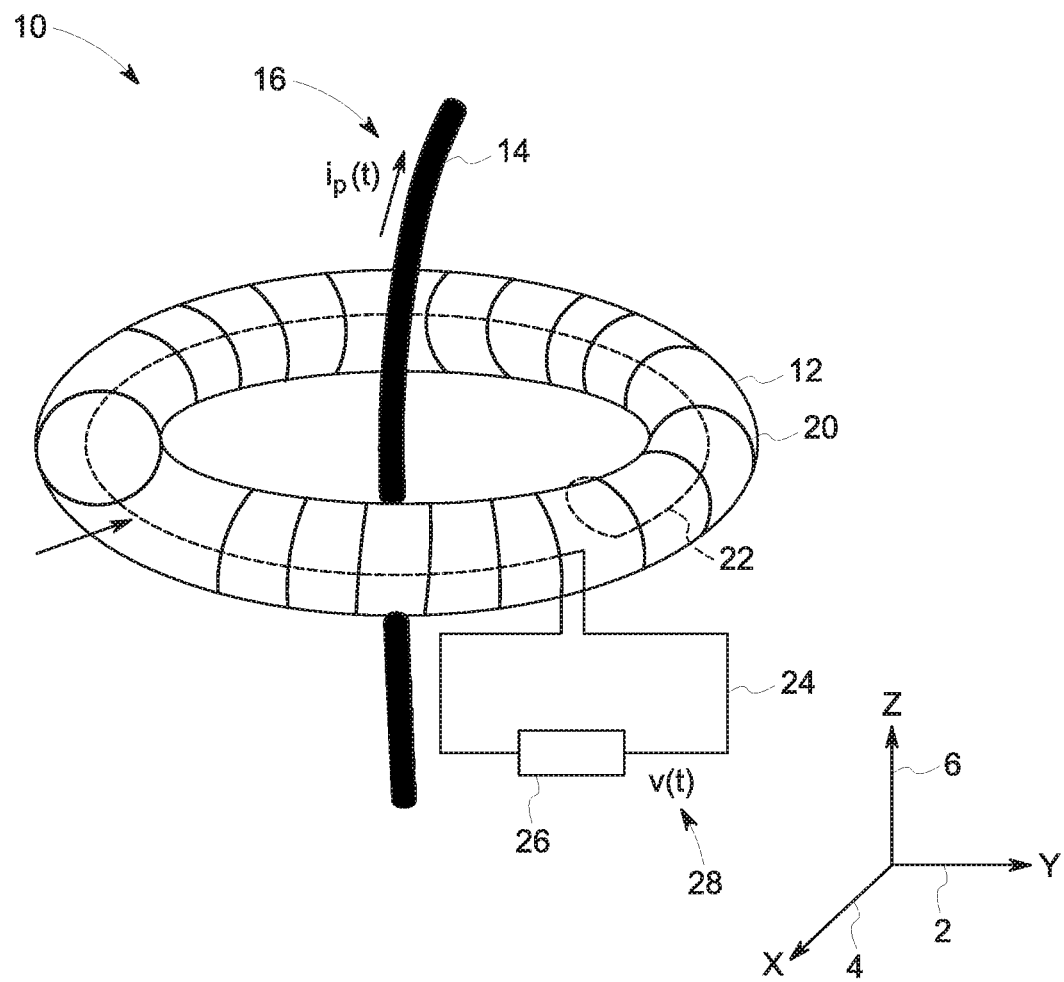
FIG. 1 is a schematic illustration of a miniaturized current sensor that employs a Rogowski coil topology, in accordance with an embodiment.

One or more specific embodiments of the present subject matter will be described below. In an effort to provide a concise description of these embodiments, certain features of an actual implementation may not be described in the specification. It should be appreciated that in the development of any such actual implementation, as in any engineering or design project, numerous implementation-specific decisions must be made to achieve the developers' specific goals, such as compliance with system-related and businessrelated constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. The application may make reference to certain electrical measurement metrics. As such, it should be understood that "W" may refer to watts, "J" may refer to joules, "A" may refer to amperes, and "V" may refer to volts.

Many modern electrical systems may employ miniaturized electrical components that may be in the sub-millimeter scale. These electrical components may be used to form drivers, actuators, controllers, and/or sensors and, as a result, may be subject to large current and/or large voltage demands. During operation, these electrical components may be subject to current and/or voltage transient spikes. Conventionally, protective circuitry, such as fuses, switches, diodes, and other voltage or current suppressors may be used to protect the electronic component or the electronic device. However, the protective circuitry may be limited in providing diagnostic information, which may include the magnitude of the current and/or voltage spike, the frequency of events, the location of the spike in the device. As such, quantitative sensors may improve the monitoring capabilities of the system. Furthermore, automatic controllers or regulators that receive data from the quantitative sensors may be used to control or protect the electrical components. For example, data from a quantitative sensor may be used by a switching circuitry to shutdown operation of the electrical component when a failure is detected. As such, quantitative sensors may further improve the reliability of the electrical devices by allowing identification of the source of current and/or voltage spikes and by allowing the design of protective circuits.

Embodiments described herein are related to current sensors that may be used in miniaturized electrical components. The current sensors described herein may be similar to Rogowski coils, as detailed below. As such, the current sensors may measure current variations, which may be appropriate to measure current and/or voltage spikes. In some embodiments, integrating circuitry may be used to measure the true current. The current sensors described herein may be mounted on the electronic components. In some embodiments, the current sensors may be integrated into the electronic components. As discussed herein current sensors integrated into the electronic components may refer to current sensors formed during the manufacture of the electronic component, such as in the construction of semiconductor based electrical components. In some embodiments, the current sensor and the electronic component may be disposed in a single integrated circuit die. In some embodiments, the current sensor may have a layer that may be common with a layer of the electronic component. As illustrated below, the current sensors described herein may be integrated into semiconductor devices, such as transistors (e.g., metal-oxide-semiconductor field-effect transistors (MOSFETs), vertical transistors (e.g., vertical MOSFETs), power transistors, lateral diffusion metal-oxide-semiconductor (LDMOS) transistors, and/or diodes (e.g., Schottky diodes, transient voltage suppressors (TVS)). The current sensors may also be integrated with more devices, such as fuses, power supply lines, and/or ground lines, and, more generally, integrated to monitor any vertical currents in a device.

With the foregoing in mind, FIG. 1 illustrates a schematic diagram of a current sensor 10 that may have the topology of a Rogowski coil. The diagram is illustrated using as reference a coordinate system that includes a Y-axis 2, an X-axis 4, and a Z-axis 6. The current sensor 10 may be formed as a coiled coil around a torus 12. In the description of coiled coils, a primary coil of the coiled coil may refer to the main coil around the torus 12 (e.g., the perimeter of around the Z-axis 6 of the torus 12) and the secondary coils may refer to the loops of the coiled coils (e.g., the perimeter of the cross-section of the torus 12). The torus 12 may be disposed in a plane formed by the Y-axis 2 and the X-axis 4. The torus 12 may be formed around a current path 14. The current sensor 10 may, thus, measure the variation (e.g., a derivative) of a current 16 that may travel along the current path 14. Current 16 may be in excess of 1 mA and current sensors may be adjusted to tolerate currents up to 50 A, up to 100 A, up to 1000 A, or more. The variation measured may be in the direction of the Z-axis 6, which may be perpendicular to the plane formed by the Y-axis 2 and the X-axis 4. The current sensor 10 may include the coiled coil 20, which lays around the torus 12. The current sensor 10 may include a return coil 22 which may be disposed along the center of the torus 12 (e.g., the primary coil), as illustrated. The coiled coil 20 and the return coil 22 may be coupled to a sensing circuit 24 and to a voltage sensor 26. Generally, the voltage 28 measured by the voltage sensor 26 may be proportional to a derivative of the current 16. In some embodiments, the voltage 28 may be the voltage v(t) between the terminals of the sensing circuit 24. The voltage v(t) may be calculated by the expression (1).

$$v(t) = -\frac{AN\mu}{l}\frac{di_p(t)}{dt} \qquad (1)$$

In expression (1), A may refer to the area of the secondary coils of the coiled coil 20 (i.e., area of the cross-section of the torus 12), N may refer to the number of secondary coils (e.g., loops) of the coiled coil 20, l may refer to the perimeter of the torus 12 (e.g., the length of the return coil 22, the length of the primary coil), and μ may refer to the magnetic permeability in the torus. In some embodiments, the voltage sensor may include integrating circuitry and, as a result, the output voltage 28 may be an integral of v(t) which may be proportional to the current 16. While FIG. 1 illustrates a current sensor 10 with circular loops, the embodiments described herein may have rectangular loops, as detailed below. It should be noted that the expression (1) may still apply, as the geometric parameters A and l are not specific to circular loops.

Figure 2:
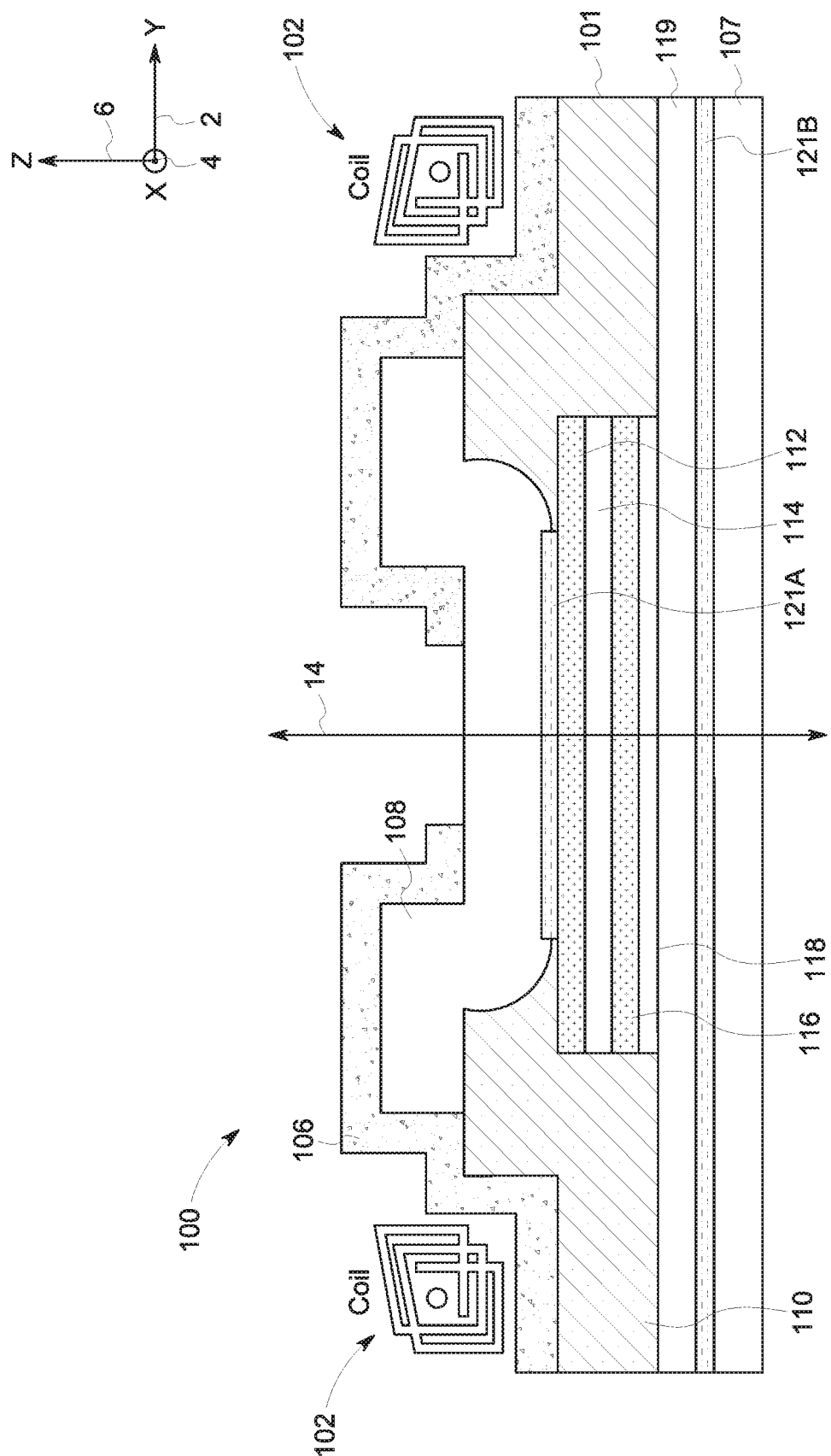
FIG. 2 is a diagram of a miniaturized current sensor mounted to a microelectronic component, in accordance with an embodiment.

FIG. 2 illustrates a cross-section of a system 100 (e.g., an integrated circuit die) having a semiconductor component integrated with a current sensor. The diagram is illustrated using as reference a coordinate system that includes a Y-axis 2, an X-axis 4, and a Z-axis 6. The system 100 may include a component 101 that may be monitored by an integrated current sensor 102 mounted on a substrate of the component 101. In the example of FIG. 2, the illustrated component 101 may be a transient voltage suppressor (TVS) device. The component 101 may allow a vertical current path 14, which may be bidirectional. The vertical current path 14 may enter and/or exit the component 101 through the external terminals formed by contact metallization 107 and 108. The current sensor 102 may, thus, be placed around the contact metallization 108 to monitor the flows (e.g., current magnitude, current variations) of the vertical current path 14. In some embodiments, a dielectric isolation layer passivation layer 106 may be placed above the component 101. The dielectric isolation layer 106 may provide electrical insulation from the metallization 108, for operation of the current sensor 102. The component 101 may include a metal oxide layer 110 may be used to provide structural support and further electrical insulation between the current sensor 102 and the component 101.

As discussed above, the component 101 may be a TVS. The TVS component may be formed by the two diode junctions. The first junction may be the p-n junction between the N layer 112 and the P layer 114 and the second junction may be the reverse p-n junction between the P layer 114 and the N layer 112. The junction may be mounted above a non-doped substrate layer 118, which may be placed above the substrate 119, and the current sensor 102 may be may be mounted above the substrate 119. The contact between the substrate and the contact metallizations 107 and 108 may be intermediated by a nickel contact layer 121A and 121B. It should be understood that the illustration of the current sensor 102 on a TVS component 101 is an illustration of usage and arrangement of the current sensor. The above arrangement may be adapted to place the current sensor 102 in other components such as vertical MOSFETs, LDMOS transistors, fuses, metal-oxide varistors, or any other component that may have a vertical current component.

Figure 3A:
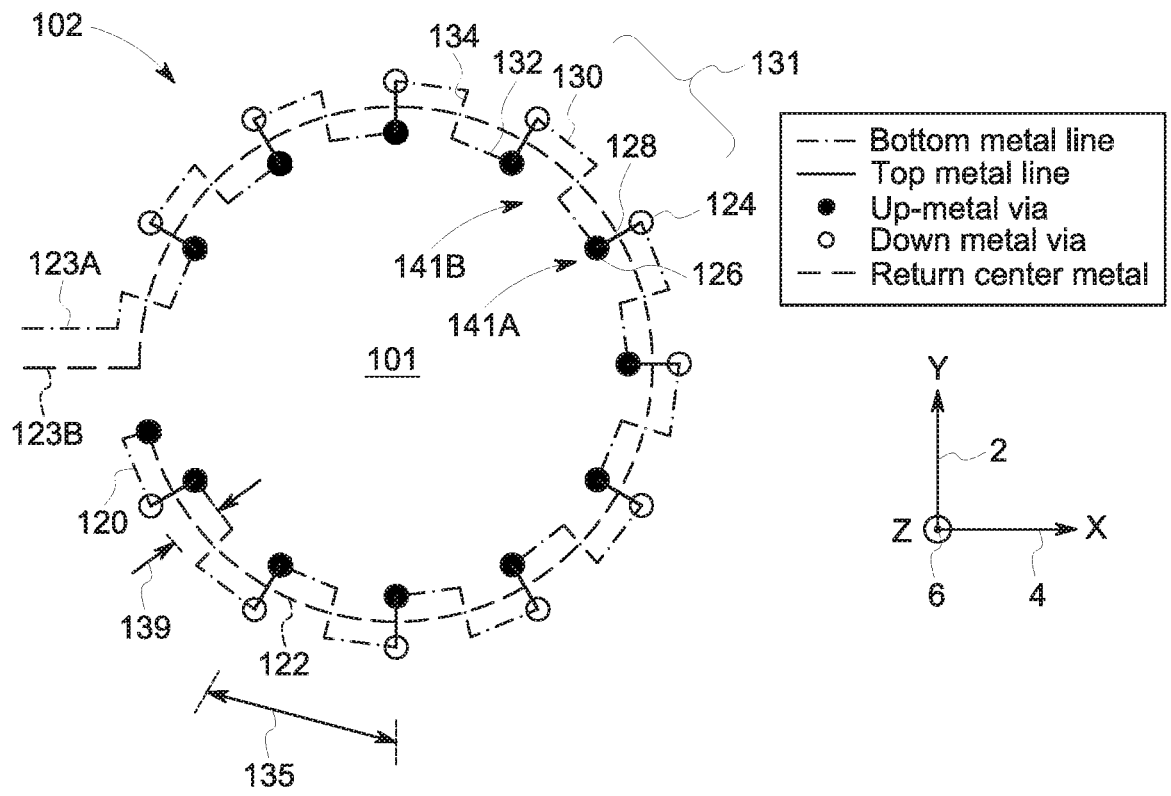
FIG. 3A is a top view of a miniaturized current sensor, in accordance with an embodiment.

FIG. 3A illustrates a top view of the current sensor 102. The diagram is illustrated using as reference a coordinate system that includes a Y-axis 2, an X-axis 4, and a Z-axis 6. As illustrated, the current sensor 102 may be placed around the component 101. The current sensor 102 may measure currents along a current path 14 in the Z-axis 6. The current sensor 102 may be formed by the coiled coil 120 and the return coil 122 and, thus, may have the topology of a Rogowski coil. The coiled coil 120 and the return coil 122 may be connected to a sensing circuit at the terminals 123A and 123B respectively.

Figure 3B:
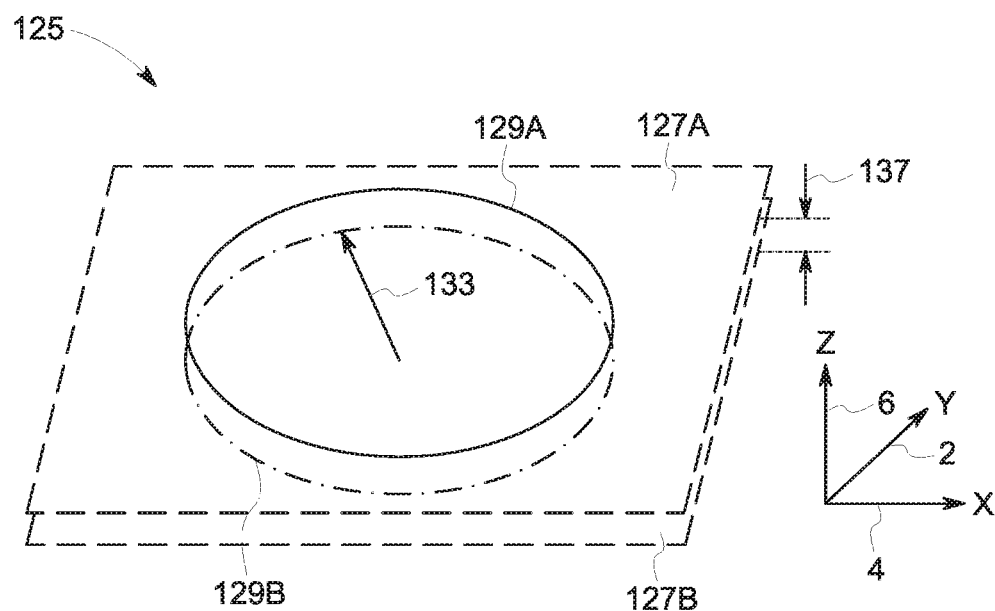
FIG. 3B is a perspective view of the top plane and the bottom plane of the miniaturized current sensor of FIG. 3A, in accordance with an embodiment.

The coiled coil 120 may be a coiled coil around a torus with a square cross-section. FIG. 3B provides a diagram 125 of parallel reference planes 127A and 127B that may be used to facilitate the description of the coiled coil 120 in FIG. 3A. The primary coil of the coiled coil 120 may be projected in the reference plane 127A as the circumference 129A and in the reference plane 144 as the circumference 129B. Thus, the coiled coil 120 may be disposed along the circumferences 129A and 129B. The coiled coil 120 may have multiple secondary coils (e.g., loop 131). Each loop 131 of the coiled coil 120 may have a top layer branch 141A and a bottom layer branch 141B. The top layer branch 141A of the loops 131 in the coiled coil 120 may be formed by an outer post 124 and an inner post 126. The outer post 124 and the inner post 126 may be connected by a top line 128 (e.g., a top metal line). The top line 128 may be disposed in the top reference plane 127A. The posts 124 and 126 may be vertical posts that connect a metal line in the top reference plane 127A to a metal line in the bottom reference plane 127B. The bottom layer branch 141B of the secondary coils (e.g., loops) in the coiled coil 120 may be formed by a bottom line 134. The bottom line 134 may be disposed in the bottom reference plane 127B. The top layer branch 141A and the bottom layer branches 141B may be connected by inner connectors 132 and outer connectors 130. For example, the top layer branch 141A may be connected to a bottom layer branch 141B of a loop 131 via the inner connector 132, and the top layer branch 141A may be connected to a bottom layer branch 141B of an adjacent loop 131. In the illustrated system, the outer connectors 130 and the inner connectors 132 may be disposed in the bottom reference plane 127B.

The return coil 122 may be disposed in a middle plane that may be parallel to and disposed between the reference planes 127A and 127B. The return coil 122 may be disposed along a projection of the primary coil in the middle plane, as illustrated in FIG. 3A. Diagram 140 in FIG. 4 further illustrates the arrangement of an upper layer branch of the coiled coil 120 as well as the disposition of the return coil 122. The diagram 140 is illustrated using as reference a coordinate system that includes a Y-axis 2, an X-axis 4, and a Z-axis 6. In the illustrated diagram, the upper layer branch is illustrated by posts 124 and 126. Posts 124 and 126 are connected by the top line 128. The posts 124 and 126 may also be connected to a bottom line 134 by the outer connector 130 and the inner connector 132. As such, the current path 144 through the coiled coil may travel from the inner connector 132 to the inner post 126, the top line 128, the outer post 124, and the outer connector 130. The diagram 140 also illustrates the return coil 122. The return current 142 may travel to through the return coil 122 in a direction opposite to the current path 144. The return coil 122 is disposed in a plane between the plane of the top line 128 and the plane of the connectors 130 and 132.

In the above-illustrated system, the voltage between terminals 123A and 123B may be calculated using the expression (1) described above, when the current sensor 102 is subject to a vertical current. In order to obtain quantitative monitoring, a quantitative mapping of the current as a function of the voltage may be obtained by employing a calibration process in which currents are applied and voltages are measured. These measurements may be used to calculate a proportionality constant α and the current may be determined using the expression (2). The measurements may also be stored in the look-up table, which may be used by the sensing circuitry coupled to terminals 123A and 123B.

$$v(t) = \alpha \frac{di_p}{dt} \quad (2)$$

A quantitative mapping may also be determined analytically using the expression (1). To that end, the perimeter l may be determined in terms of the radius 133 of the primary loop, the number of secondary loop N may be determined as a ratio of the perimeter l and the loop-to-loop separation 135, and the area A may be calculated as the product of the height 137 (e.g., the vertical separation between the reference planes 127A and 127B) and the width 139 of the secondary loop (e.g., the length of the top metal line or the length of the bottom metal line). The radius 133 of the primary loop may be as small as, for example, 0.1 mm, and may be adjusted to be as large as several centimeters (e.g., 1 mm radius, 10 mm radius, 0.1 cm radius, 1 cm radius), based on the dimensions of the monitored component 101. The pitch 135 (e.g., loop-to-loop separation) may be between in a range between 1 μm to 20 μm. The relationship between the radius 133 and the pitch 135 may determine the number of coils. For example, the current sensor 102 for a component 101 with dimensions 1 cm×1 cm may have a 0.5 cm radius 133) and a 10 μm pitch 135. As a result, the number of coils (e.g., N of expression (1)) in the current sensor may be as large as 4000. Since the sensitivity of the sensor may be related to the ratio of the number of coils by the length of the perimeter, N/l of expression (1), the miniaturized current sensors may be tuned to detect very small current changes.

The height 137 may be determined based on layer-to-layer separation of the fabrication methods employed, and may be, for example, in a range between 5 µm and 100 µm. The width 139 may be between 0.1 µm and 10 µm, based on the available fabrication methods. The specific dimensions that are used in the construction of a current sensor 102 may be determined based on the dimensions of the component 101, which may range from few micrometers, such as in TVS, diodes, and vertical transistors, to centimeters, such as in metal-oxide varistors. The dimensions of the current sensor 102 may also be adjusted based on the methods for fabrication of the component 101 employed, such as the smallest size of features of the photoresist, and the dimensions of the layers. It should be noted that the dimensions may also be adjusted based on the expected current levels transported by the component 101.

It should be understood that variations to the geometry of the current sensor 102 that provide the coiled coil and the return coil are contemplated in the descriptions herein. For example, in some embodiments, which the inner connectors 132 and outer connectors 130 may be disposed in the top reference plane 127A. In some embodiments, the inner connectors 132 may be disposed in the top reference plane 127A and the outer connectors 130 may be disposed in the bottom reference plane 127B and, conversely, in some embodiments the inner connectors 132 may be disposed in the bottom reference plane 128A and the outer connectors 130 may be disposed in the top reference plane 127A. In some embodiments, the inner connectors 132 and the outer connectors 130 may be disposed in the same plane as the return coil (e.g., the middle plane). As such, it should be understood that connectors are configured to couple electrically top metal lines to adjacent bottom metal lines, through the post. Moreover, the connectors may also be formed in an inclined plane relative to the top reference plane 127A. For example, the connectors may be inclined relative to reference planes 127A and 127B. In some embodiments using inclined connectors, the height of the posts (e.g., posts 124 and 126) may be shortened accordingly. In some embodiments, the inclination of the plane may allow the connectors to directly connect the top lines 128 in the top reference plane 127A to the bottom line 134 in the bottom reference plane 127B, without the use of posts. While the connectors described herein are straight connectors, embodiments having round connectors may also be used.

Moreover, it should be understood that in some embodiments, the current sensor 102 may be arranged in a different manner relative to the electrical component 101. For example, in some embodiments, the current sensor 102 may be formed in an integrated circuit die that is different from the integrate circuit die of the component 101, and the two dies may be stacked, to perform the monitoring. Moreover, in some embodiments, the current sensor 102 may be disposed in a separate die that may have a route (e.g., a pillar, a via) forming the current path 14. Such embodiment may be used, for example, by placing the current path in series with a monitored component 101. Such embodiment may be used, for example, to monitor currents of components 101 with dimensions that may not accommodate the current sensor 102.

Figure 4:
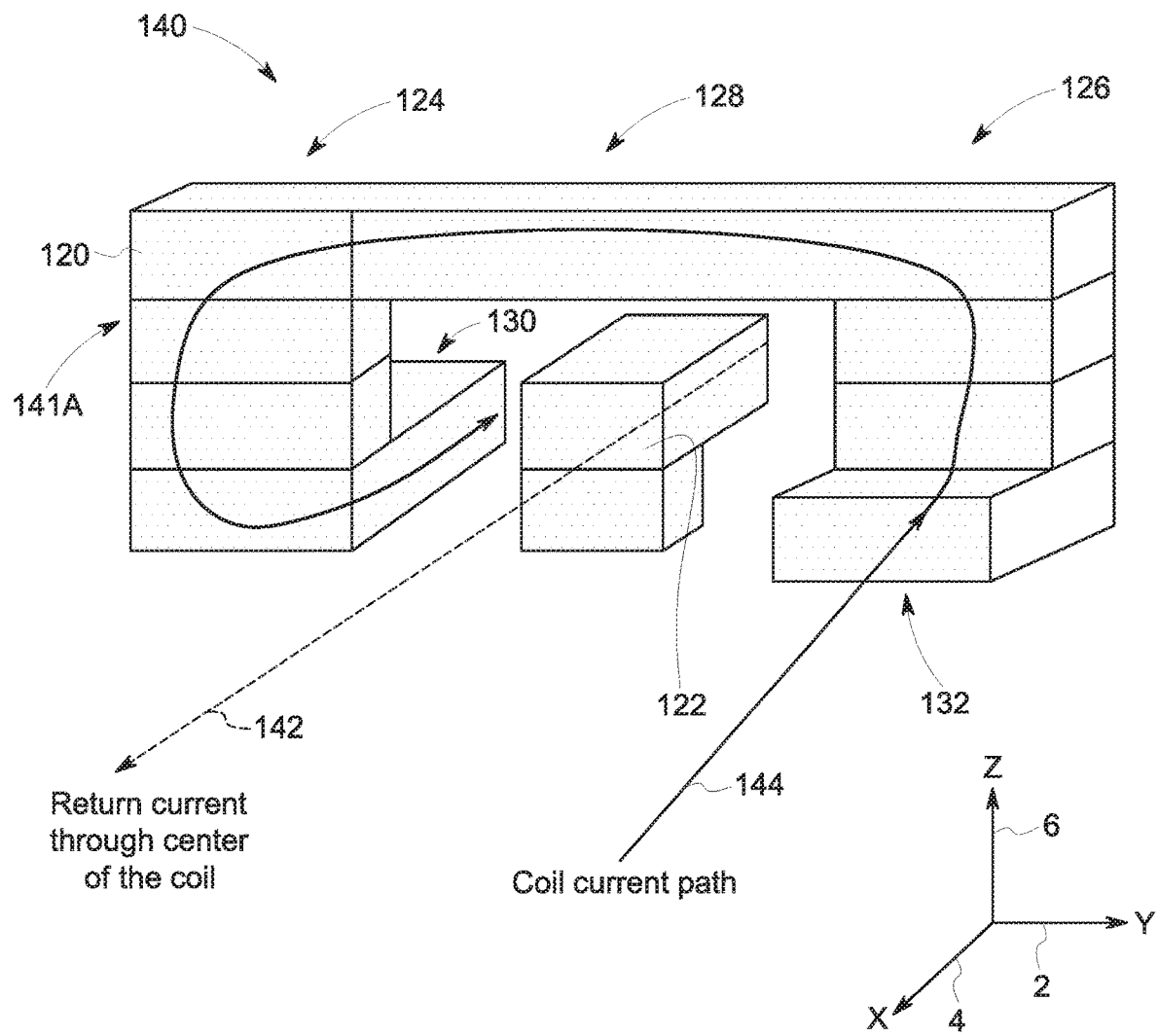
FIG. 4 is a perspective view of a loop of a coiled coil of the current sensor of FIG. 3A, in accordance with an embodiment.

With the foregoing in mind, FIGS. 5A-G illustrate a method to form the current sensor 102. The diagram illustrates the formation of the upper layer branch and the return coil, as illustrated in FIG. 4. In a first process, illustrated by diagrams 150 of FIG. 5A and 160 of FIG. 5B, a first layer associated with the lower plane of the coiled coil 120 may be placed. The first layer may be formed above the substrate 151 of component 101. As discussed above, the substrate 151 may be a dielectric isolation layer, such as a nitride passivation layer or a metal-oxide layer. A seed metal 154 may be sputtered above the substrate of the component 101. A photoresist layer 152 may be patterned above the substrate. A second metallization layer may be plated above the seed metal 154 to form the metal lines 156A and a supporting post 156B.

Figure 5A:
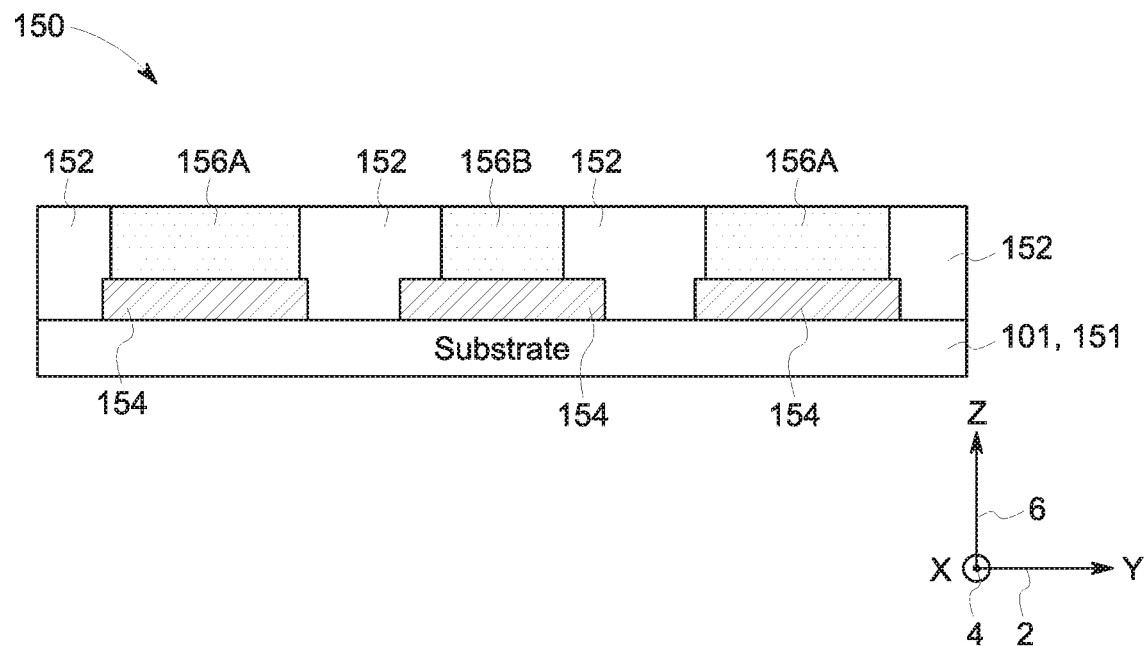
FIG. 5A is a front view illustrating a first process of a method to form a miniaturized current sensor coil, in accordance with an embodiment.
Figure 5B:
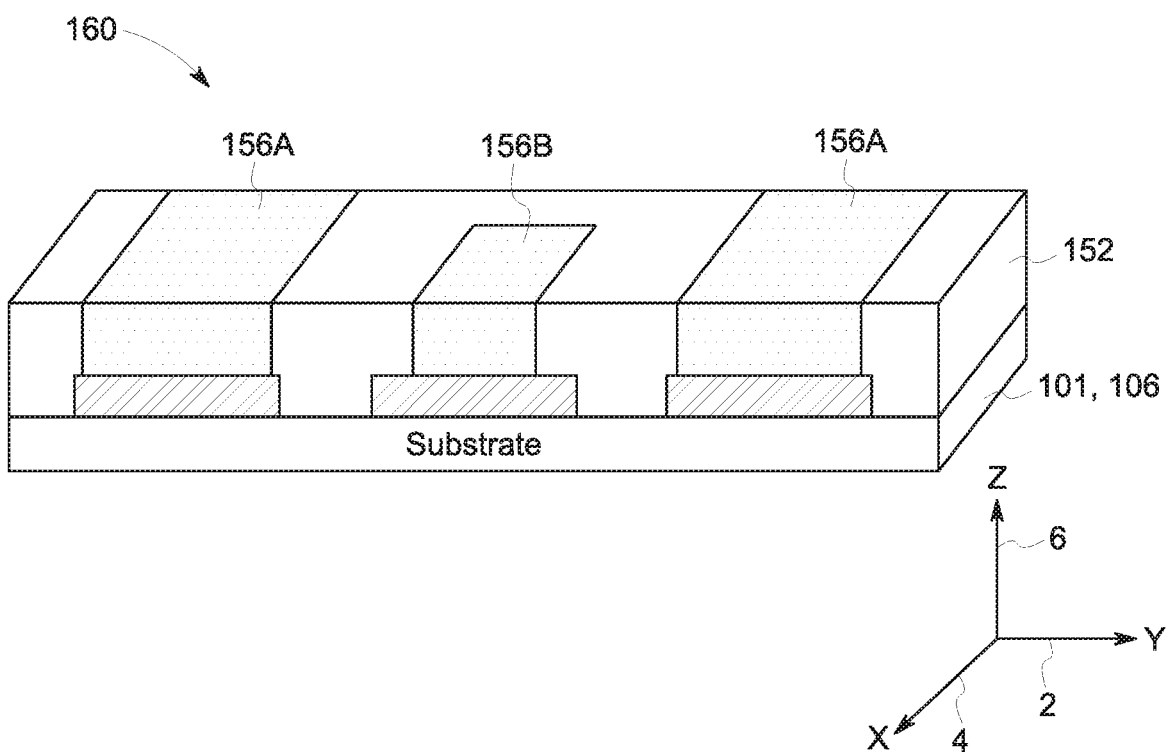
FIG. 5B is a perspective view illustrating the first process of FIG. 5A.
Figure 5C:
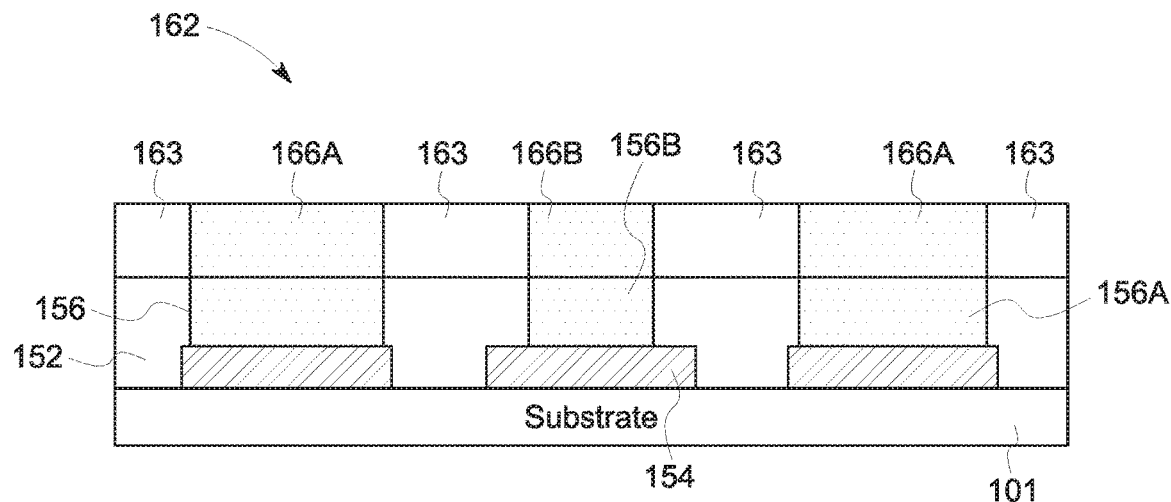
FIG. 5C is a front view illustrating a second process of a method to form a miniaturized current sensor, in accordance with an embodiment.
Figure 5D:
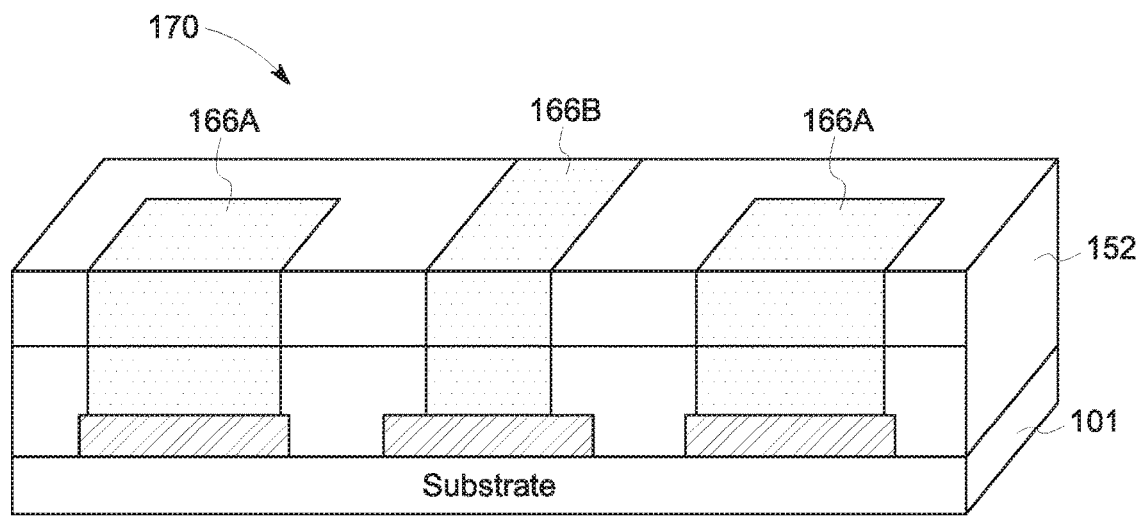
FIG. 5D is a perspective view illustrating the second process of FIG. 5C.
Figure 5E:
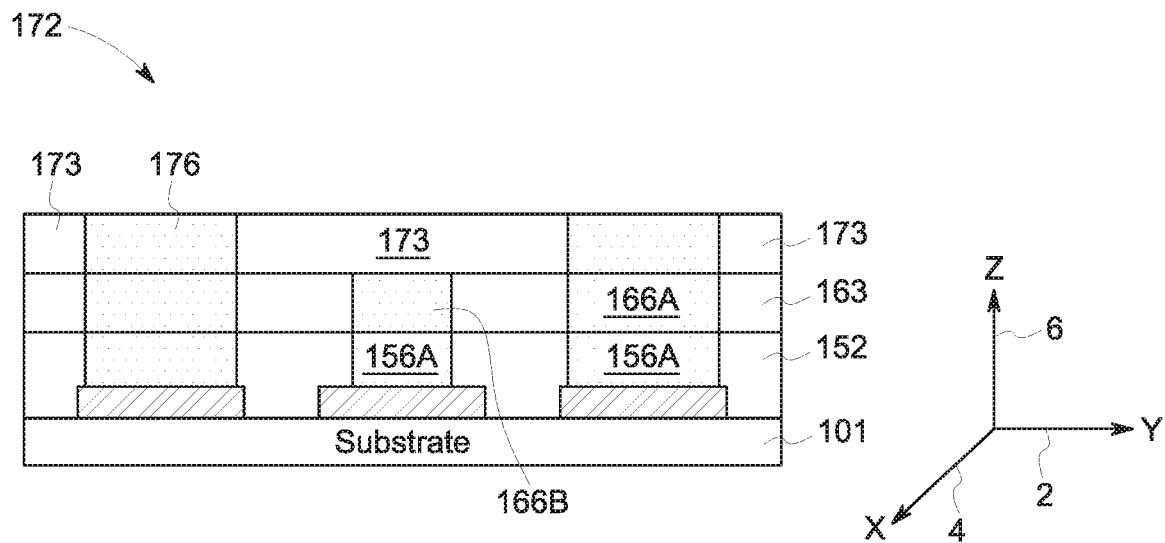
FIG. 5E is a front view illustrating a third process of a method to form a miniaturized current sensor, in accordance with an embodiment.

In a second process, illustrated by diagrams 162 of FIG. 5C and 170 of FIG. 5D, a second layer associated with the return coil may be formed. To that end, a second photoresist layer 163 may be patterned above the first layer. The third metallization layer may be plated in the regions patterned by the second photoresist layer 163 to form metal posts 166A and a metal line 166B. The metal line 166B may form a portion of the return coil, and may be supported by supporting post 156B. In a third process, illustrated by diagram 172 of FIG. 5E, a third layer may be formed. To form that layer, a third photoresist layer 173 may be patterned. A fourth metal layer may be plated may be formed above the third metal layer, to form the metal posts 176. Note that the third photoresist layer 173 may be placed above the metal line 166B.

Figure 5F:
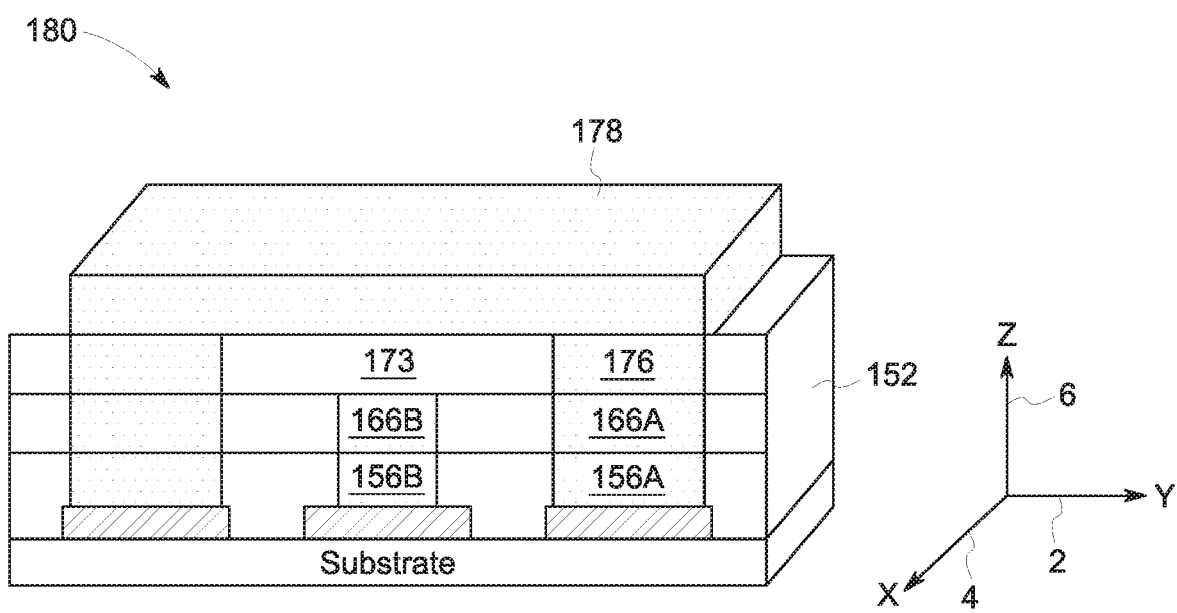
FIG. 5F is a perspective view illustrating a fourth process of a method to form a miniaturized current sensor, in accordance with an embodiment.
Figure 5G:
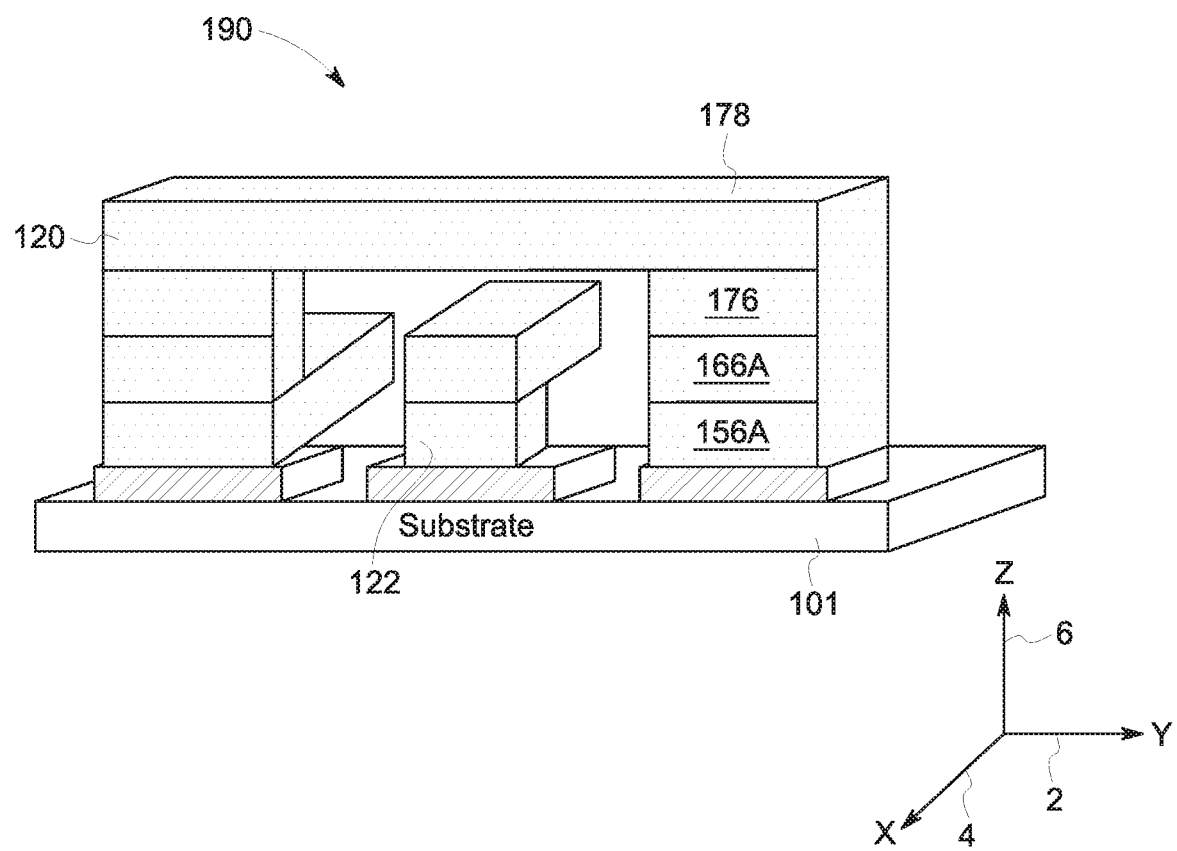
FIG. 5G is a perspective view illustrating a fifth process of a method to form a miniaturized current sensor, in accordance with an embodiment.

In a fourth process, illustrated by diagram 180 of FIG. 5F, a fourth layer may be formed. To that end, a top metal layer 178 may be deposited, to connect the two metal posts 176. Note that the third photoresist layer 173 may insulated the top metal layer 178 from the metal line 166B. In a fifth process, illustrated by diagram 190 of FIG. 5G, the photoresist layers may be dissolved. For example, the photoresist layers may be photoresist layers that may be dissolved.

The above describe embodiments may be used to construct miniaturized current sensors that may be used to monitor electronic components with reduced dimensions (e.g., sub-millimetric components) and/or control the circuitry associated with these electrical components. The use of the current sensors may allow the determination of the shape of the current waveforms during transient events, such as voltage spikes and/or current spikes. The shape of the waveforms may be used to facilitate the determination of the source of the transient events. As an example, a TVS device with an integrated current sensor, such as the one described above, may be used to identify the root cause of transient voltage events in the system. Moreover, the current sensors may be coupled to logic circuitry that can control the system. As an example, as the integrated current sensor measures an activation of the TVS device, that may be associated with an excessive current in the system, a protective logic circuit that receives data from the current sensor may deactivate the associated circuitry (e.g., deactivate the load, shift the load). The integrated device having both the TVS and a current sensor may, thus, protect the system from voltage spikes and provide diagnostic information related to the voltage spikes. As another example, a vertical power MOSFET with an integrated current sensor, such as the one described above, may be used to identify a source of a breakdown event due to a reverse voltage in excess of the breakdown voltage of the MOSFET device.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An integrated circuit die comprising:
an electronic component configured to transport a current through a current path; and
a current sensor integrated with the electronic component and disposed around the current path, wherein the current sensor comprises:
a coiled coil disposed around the current path, wherein the coiled coil comprises a plurality of loops, wherein a first termination is coupled to the coiled coil, wherein each respective loop of the plurality of loops comprises a respective top line, a respective bottom line, and a respective first connector that couples the respective top line to the respective bottom line, wherein the coiled coil comprises a plurality of second connectors, wherein each second connector couples the respective top line of a first loop of the plurality of loops to the respective bottom line of a second loop of the plurality of loops, wherein the second loop is adjacent to the first loop, and wherein each respective loop of the plurality of loops comprises a first post that couples the respective top line to the respective first connector and a second post that couples the respective top line to an adjacent second connector;
a return coil disposed around the current path and connected to the coiled coil, wherein a second termination is coupled to the return coil; and
a voltage sensor coupled to the first termination and the second termination.

2. The integrated circuit die of claim 1, wherein the electronic component comprises a transient voltage suppressor (TVS), a vertical metal-oxide-semiconductor field-electric transistor (MOSFET), or a lateral diffusion metal-oxide-semiconductor (LDMOS) transistor.

3. The integrated circuit die of claim 1, comprising integrating circuitry coupled to the voltage sensor.

4. The integrated circuit die of claim 1, wherein a radius of the coiled coil is larger than 100 µm and smaller than 10 mm.

5. The integrated circuit die of claim 1, wherein a height of each loop is between 5 µm and 100 µm or a width of each loop is between 0.1 µm and 10 µm, or both.

6. A method to form a current sensor on a semiconductor device, comprising:
patterning a first photoresist layer above a substrate of the semiconductor device;
depositing a first metal layer above the substrate, wherein the first metal layer comprises a bottom metal line, a portion of a first connector, a portion of a second connector, a portion of a third connector, and a supporting post for a return coil, wherein the bottom metal line connects the first connector to the third connector;
patterning a second photoresist layer above the first metal layer;
depositing a second metal layer above the first metal layer, wherein the second metal layer comprises a portion of a first post coupled to the first connector, a portion of a second post coupled to the second connector and a portion of the return coil coupled to the supporting post;
patterning a third photoresist layer above the second metal layer, wherein the third photoresist layer comprises a photoresist above the portion of the return coil;
depositing a third metal layer above the third photoresist layer, wherein the third metal layer comprises a top metal line, wherein the first post couples the top metal line to the first connector and the second post couples the top metal line to an adjacent second connector, and wherein the first connector, the first post, the top metal line, the second post, the second connector, the bottom metal line, and the third connector form a portion of a coiled coil of the current sensor.

7. The method of claim 6, wherein the substrate comprises dielectric isolation layer.

8. The method of claim 6, comprising dissolving the first photoresist layer, the second photoresist layer, and the third photoresist layer.

9. A current sensor comprising:
a coiled coil disposed along a primary coil around a current path, and comprising a plurality of loops, wherein each respective loop comprises:
a respective top metal line disposed in a top plane;
a respective bottom metal line disposed in a bottom plane parallel to the top plane;
a respective first straight connector configured to electrically couple the respective top metal line to the respective bottom metal line;
a respective first post that connects the respective top metal line to the respective first straight connector;
a respective second straight connector configured to couple the respective bottom metal line to a second top metal line of an adjacent loop of the plurality of loops; and
a respective second post that connects the second top metal line to the respective second straight connector;
a return coil connected to the coiled coil and disposed along the primary coil around the current path in a middle plane parallel to the top plane and disposed between the top plane and the bottom plane, wherein the return coil is connected to the coiled coil at a first end of the return coil; and
a voltage sensor connected to the return coil at a second end of the return coil and to the coiled coil.

10. The current sensor of claim 9, wherein each respective first straight connector is disposed in an inclined plane that is inclined relative to the top plane.

11. The current sensor of claim 9, wherein a radius of the primary coil is larger than 100 µm and smaller than 10 mm.

12. The current sensor of claim 9, wherein a vertical separation between the top plane and the bottom plane is between 5 µm and 100 µm, wherein a length of each respective top metal line is between 0.1 µm and 10 µm, or both.

13. The integrated circuit die of claim 1, wherein the current sensor enables determining waveform shapes of the current during current spikes and voltage spikes.

14. The integrated circuit die of claim 3, wherein the voltage sensor is configured to control the integrating circuitry associated with the electronic component.

\* \* \* \* \*